United States Patent [19]
Ohishi

[11] Patent Number: 5,666,038
[45] Date of Patent: Sep. 9, 1997

[54] POSITIONING TABLE DEVICE INCLUDING CORRECTION OF ENERGIZATION ELECTRIC CURRENT TO SELECTED COILS OF A PERMANENT MAGNET OF A DRIVE DEVICE

[75] Inventor: Shinji Ohishi, Oyama, Japan

[73] Assignee: Canon Kabushiki Kaisha, Tokyo, Japan

[21] Appl. No.: 263,000

[22] Filed: Jun. 21, 1994

[30] Foreign Application Priority Data

Jun. 24, 1993 [JP] Japan .................. 5-175959
Dec. 6, 1993 [JP] Japan .................. 5-305303

[51] Int. Cl.$^6$ .................................... B64C 17/06
[52] U.S. Cl. .......................... 318/625; 318/649
[58] Field of Search .................. 318/626, 648, 318/649, 629, 611; 310/51

[56] References Cited

U.S. PATENT DOCUMENTS

| | | | |
|---|---|---|---|
| 3,986,092 | 10/1976 | Tijsma et al. | 318/649 |
| 4,390,827 | 6/1983 | Imahashi. | |
| 4,490,659 | 12/1984 | Hansen | 318/484 |
| 4,810,941 | 3/1989 | Ohishi et al.. | |
| 4,929,874 | 5/1990 | Mizuno et al. | 318/649 X |
| 5,047,676 | 9/1991 | Ichikawa | 310/12 |
| 5,156,370 | 10/1992 | Silcox et al. | 318/648 X |
| 5,184,055 | 2/1993 | Ohishi et al. | 318/615 |
| 5,196,745 | 3/1993 | Trumper | 310/12 |
| 5,260,580 | 11/1993 | Itoh et al.. | |
| 5,369,348 | 11/1994 | Gennesseaux | 318/623 |
| 5,378,974 | 1/1995 | Griffin | 318/649 |

FOREIGN PATENT DOCUMENTS 0055334 7/1982 European Pat. Off..

OTHER PUBLICATIONS

Patent Abstracts of Japan, Kokai No. 62-123983, vol. 11, No. 343, Nov. 1987.

Primary Examiner—Jonathan Wysocki
Attorney, Agent, or Firm—Fitzpatrick, Cella, Harper & Scinto

[57] ABSTRACT

A positioning table device includes a table, a guide for guiding movement of the table in a predetermined direction, a drive device for moving the table along the predetermined direction, the driving device including a permanent magnet provided on the table and a plurality of coils provided along the predetermined direction, a position detecting device for detecting a position of the table in the predetermined direction, a designating device for designating an energization electric current in accordance with an output of the position detecting device, a coil selector for selecting a coil, of the coils to be energized, in accordance with the position of the table in the predetermined direction, a correcting device for correcting the energization electric current designated by the designating device when the coils to be energized are changed by the coil selecting device, such that a change in coil energization electric current is slowed whereby combined energization electric currents applied to the coils are maintained substantially at a constant magnitude, and a current supply device for energizing the selected coil in accordance with the corrected energization electric current.

8 Claims, 15 Drawing Sheets

CURRENT 1

PA1_OUT & PA2_OUT

CURRENT 2

CURRENT 1 + CURRENT 2

CURRENT 1

PA1_OUT & PA2_OUT

CURRENT 2

CURRENT 1 + CURRENT 2

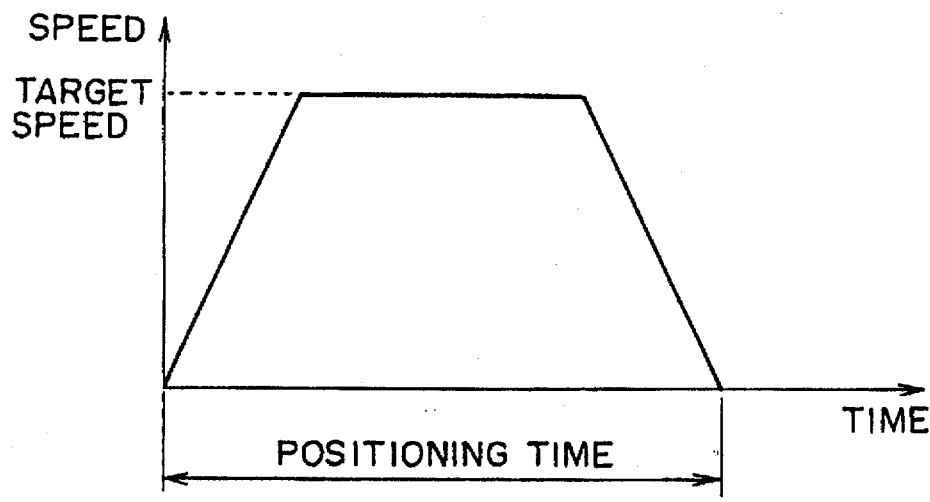
FIG. 14
PRIOR ART
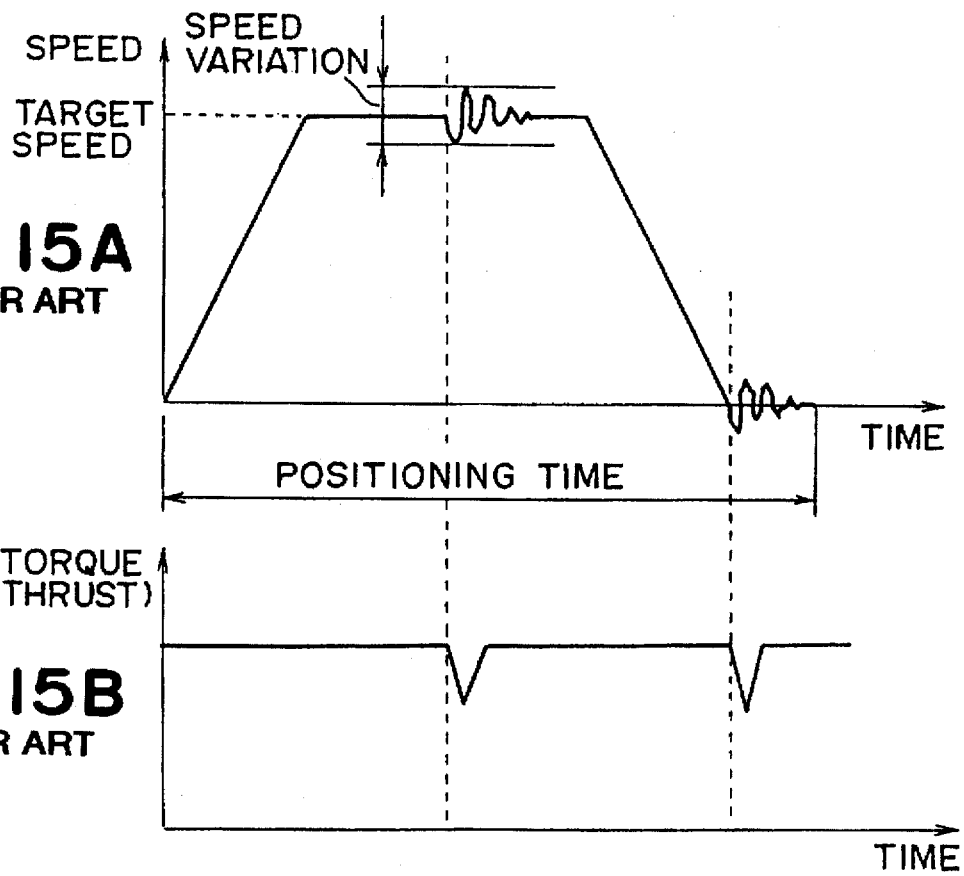
FIG. 15A
PRIOR ART
FIG. 15B
PRIOR ART

POSITIONING TABLE DEVICE INCLUDING CORRECTION OF ENERGIZATION ELECTRIC CURRENT TO SELECTED COILS OF A PERMANENT MAGNET OF A DRIVE DEVICE

FIELD OF THE INVENTION AND RELATED ART

This invention relates to a positioning table device usable in a precise machining instrument or a semiconductor device manufacturing exposure apparatus, for example. More particularly, the invention is concerned with a positioning table device having a position detector for detecting the position of a table and a multiphase type motor for selectively changing coils to be energized, in accordance with the position of the table.

FIG. 10 is a schematic view of a positioning table device. As illustrated, the device comprises linear motor coil means 104 having four coils (four phases) arrayed along a straight line. The linear motor coil means 104 is supported by a coil supporting member 103, and a pair of guides 102 extends in parallel to the array of the coils constituting the linear motor coil means 104. Mounted on the guides 102 are a pair of upper and lower table top plates 101 which are disposed to sandwich the linear motor coil means 104 therebetween, with the intervention of guide means 112. These top plates 101 can be slidably moved in the direction of the coil array while being guided by the guides 102. The guide means 112 comprises any one of rolling, sliding and static pressure guiding means, for example, which can be selected suitably in consideration of the positioning precision or easiness of maintenance, for example. Each of the upper and lower top plates 101 is provided with movable magnet means 105 which comprises four permanent magnets disposed along the coil array with their magnetic poles disposed alternately. These movable magnets 105 are mounted to the table top plate 101 through the linear motor coil means 104 so that different magnetic poles are opposed to each other.

Provided at the side of the guide 102 is a position detector 106 such as a linear scale, for example, for detecting the position of the table top plate 101. Connected to this position detector 106 is a counter unit 107 for detecting a position signal of the table. Connected to this counter unit 107 is a phase changing controller 109 for changing the coil phase. The controller 109 serves to actuate switches 110 in accordance with the table position signal from the counter unit 107. The coil phase is connected to corresponding switch 110 through a corresponding current amplifier 111, such that in response to coil selection signals outputted from the controller 109 the switches 110 are actuated to change the voltage application to the coils. Connected to the counter unit 107 is a servo controller 108 which serves to calculate a difference between the target position of the table and the current position thereof as detected through the counter unit 107, and to supply corresponding signals to the switches 110.

FIG. 11 shows an example of a linear motor coil energization pattern in a positioning table device. Here, for convenience of explanation, four coils constituting linear motor coil means are denoted in the drawing as coil 1, coil 2, coil 3 and coil 4, in order from left to right. Reference characters A and B each denotes the direction of flow of electric current, flowing through the coil. That is, character A denotes the flow of current in the direction of depth (forward) as viewed in the sheet of the drawing, and character B denotes the flow of current in the backward direction as viewed in the sheet of the drawing.

It is seen from portions (a)–(h) of FIG. 11 that the coil to be energized as well as the direction of electric current flowing through the coil are changed in accordance with the position of the movable magnet 105, to produce a thrust in the same direction by which the movable magnet 105 is moved in a predetermined direction and to cause movement of the table.

FIG. 16 is a schematic view of another example of a positioning table device. As illustrated, the device includes linear motor coil means 104 having four coils disposed along a straight line. The linear motor coil means 104 is supported by a coil supporting member 103, and a pair of guides 102 extend in parallel to the array of the coils constituting the linear motor coil means 104. Mounted on the guides 102 through guide means 112 is a table top plate 101 which can be slidably moved in the direction of the coil array while being guided by the guides 102.

The guide means 112 comprises any one of rolling, sliding and static pressure guiding means, for example, which can be selected suitably in consideration of the positioning precision or easiness of maintenance, for example. The table top plate 101 is provided with movable magnet means 105 which comprises four permanent magnets disposed along the coil array with their magnetic poles disposed alternately.

Provided at the side of the guide 102 is a position detector 106 such as a linear scale, for example, for detecting the position of the table top plate 101. Connected to this position detector 106 is a counter unit 107 for detecting a position signal of the table. Connected to this counter unit 107 is a phase changing controller 109 for changing the coil phase. The controller 109 serves to actuate switches 110 in accordance with the table position signal from the counter unit 107. The coil phase is connected to corresponding switch 110 through a corresponding current amplifier 111, such that in response to coil selection signals outputted from the controller 109 the switches 110 are actuated to energize the coils.

Connected to the counter unit 107 is a servo controller 108 which serves to calculate (e.g. by PID calculation) a difference between the target position of the table and the current position thereof as detected through the counter unit 107, and to supply corresponding signals to a multiplier 130.

It is known that, in a linear motor structure of such an arrangement as described, due to leaking magnetic flux of a permanent magnet, there occurs a thrust decrease (thrust ripple) in the vicinity of the phase change position. FIG. 17 shows the relationship between the table position and the thrust produced by a linear motor. Reference characters L1–L4 each denotes a position where the phase is changed. If such a thrust characteristic can be detected beforehand, it is possible to determine a correction coefficient such as depicted in FIG. 18. Actually, data for executing correction at a certain pitch P1 is memorized in a read only memory (ROM) 133. In accordance with the position of the table 101, a ripple correction controller 140 reads the correction coefficient data out of the memory 133, and a multiplier 130 multiplies it by a control signal outputted from the servo controller 108.

In this example, the phase changing controller 109, the ripple correction controller 140 and the servo controller 108 are all accomplished by software computation by a central processing unit (microcomputer). The corrected signal outputted by the multiplier 130 is transmitted to the switch 111 through a digital-to-analog (D/A) converter 131. The correction pitch P1 is determined, within a range allowed by the capacity of the memory. The thrust ripple of the linear motor can be corrected in this manner.

SUMMARY OF THE INVENTION

In the example of FIG. 10, the coils (phases) are changed one by one at predetermined positions in response to digital signals (on/off signals). Thus, at the moment of changing the coil, the motor current decreases largely.

FIG. 12 shows details of a current feedback (FB) system of this example. For convenience of explanation of the operation, only coils 1 and 2 are illustrated. Denoted at 120 is a power operational amplifier of a gain 1000× for supplying an electric current to the motor. Denoted at 121 is an operational amplifier for detecting the magnitude of current on the basis of a motor coil electric potential difference. Reference numerals 122 each denotes saturation of a corresponding output. In this example, the output of the power operational amplifier 120 is saturated at ±28 V, while the operational amplifier 121 is saturated at ±12 V.

FIGS. 13A–13D illustrate waveforms when the coil to be energized at the moment 10 msec is changed from coil 1 to coil 2. In this example, the servo controller 108 supplies a signal to cause a flow of electric current of 3A. The phase changing controller 109 produces a digital signal (on/off signal) for turning corresponding switch 110 and, as a result, a step signal such as shown in FIG. 13A or 13B is applied to a corresponding switch. However, due to the presence of the saturation element 122 in the current loop, there is saturation in the output of the power operational amplifier 120 such as shown in FIG. 13C. As a consequence of this, the current 1 and the current 2 do not follow the step signal, and the response such as illustrated in FIG. 13A or 13B results.

Since the sum of them provides the motor current, there occurs a large current decrease at the time of changing operation, such as shown in FIG. 3D. Since the motor torque (thrust) is proportional to the magnitude of this electric current, the torque decreases in response to the changing operation.

Now, some inconveniences caused if such a torque decrease (phase change) occurs during constant speed movement or in the vicinity of a target position, will be explained. FIG. 14 is a graph in a case where no torque decrease occurs during table movement, and FIG. 15 is a graph in a case where torque decrease (phase change) occurs.

In the graph of FIG. 15, as compared with that of FIG. 14 having no torque decrease, the decrease of torque leads to a degraded servo characteristic (followability), thus making the table position vibratory.

In a semiconductor exposure apparatus and when an exposure operation (scanning exposure operation) is to be made during constant speed movement, such an uneven movement speed is undesirable since it leads to degraded circuit pattern printing precision. Further, any uneven torque in the vicinity of the target position causes decreased positioning precision or prolonged positioning time, thus adversely affecting the control system.

In the example of FIG. 16, a correction coefficient is calculated on the basis of a thrust characteristic measured beforehand, and it is stored into the memory 133. The stored correction coefficient is read out in accordance with the position of the table 101, on the basis of which the thrust ripple of the linear motor is corrected. In this arrangement, however, if the thrust characteristic changes with time, it is no longer possible to perform exact correction. In a critical case, the linear motor has to be demounted from the table and its thrust characteristic has to be measured again to renew the correction coefficient. This takes a lot of time.

If, on the other hand, the correction pitch is made smaller to assure correction of better precision, a larger capacity of memory is required to store the correction coefficient.

Now, a case where the thrust ripple correction is insufficient will be explained. FIG. 19 shows a waveform in a case where no thrust ripple occurs during movement of a table. FIG. 20 shows a case where thrust ripple occurs. Comparing the graph of FIG. 20 with FIG. 19 (no ripple), it is seen that the servo characteristic (followability) is degraded by the thrust ripple and the table position becomes vibratory.

As described, in a semiconductor exposure apparatus and when an exposure operation (scanning exposure operation) is to be made during constant speed movement, such uneven movement speed is undesirable since it degrades the circuit pattern printing precision. Further, uneven torque in the vicinity of the target position results in decreased positioning precision or prolonged positioning time, thus adversely affecting the control system.

It is accordingly an object of the present invention to provide an improved positioning table device by which a decrease of torque in a multiphase motor at the time of phase change can be minimized to attain higher positioning precision and reduced positioning time.

In accordance with an aspect of the present invention, there is provided a positioning table device, comprising: position detecting means for detecting the position of a table; a multiphase motor having a plurality of coils, for moving the table; designating a means for designating magnitude of an energizing electric current for each coil; selecting means for selecting one or more of said coils to be energized, in accordance with the position of the table; a servo circuit for controlling an electric current to be applied to the selected coil or coils so that it becomes equal to the level of the designated magnitude; and control means for slowing a change in an energizing electric current magnitude signal to be applied to said servo circuit in response to the coil selection and change, so as to substantially avoid a change in magnitude of combined electric current to each coil.

In accordance with another aspect of the present invention, there is provided a positioning table device, comprising: position detecting means for detecting the position of a table; a multiphase motor having a plurality of coils which are adapted to be selectively energized in accordance with the position of the table; and multiplying means for multiplying a coil selection signal with a designated magnitude of electric current to be applied to each coil. In this aspect of the present invention, a non-step signal of energizing electric current magnitude can be applied to a servo circuit.

In one preferred form of the second aspect of the invention described above, upon coil selection and change a coil selection signal (digital signal) is applied to the multiplying means with a delay defined by a filter circuit, whereby the change in the energizing electric current magnitude signal to be applied to the servo circuit is slowed. The delay time should preferably be determined so as not cause saturation of the electric current control loop.

With this arrangement, when the table is moved while the coils are changed sequentially in accordance with a predetermined energization pattern, a designated electric current to be applied to the servo circuit for coil energization can be changed slowly such that the combined electric current to the coils can be maintained substantially constant before and after the coil change. Thus, a decrease in torque at the coil change can be minimized.

In one preferred form of the invention, multiplying means for multiplying a coil selection signal with a designated electric current magnitude to each coil is provided, and also a delay of the coil selection signal is set to avoid saturation of an electric current loop just after the coil change. Particularly satisfactory results are attainable with this arrangement.

It is another object of the present invention to provide an improved table positioning device by which proper correction of thrust ripple of a linear motor is held constantly, whereby higher positioning precision and shorter positioning time are assured.

In another aspect of the present invention, to achieve this object, means is provided to read, during constant speed movement, the magnitude of motor electric current at a predetermined measurement pitch. This allows estimation of the motor thrust to determine a proper correction coefficient.

Means may be provided to apply a certain external force in the movement direction of the table, to assure flow of an electric current (bias current) during the constant speed movement. Further, the pitch of correction may be changed between that in a region adjacent to the phase changing position and that in the other regions.

With the arrangement of the present invention in this aspect, the motor thrust can be estimated while the linear motor is kept incorporated in the table device. Thus, a proper correction coefficient can be determined promptly, and good conditions of the positioning table device can be held constantly.

Also, changing the correction pitch is effective to reduce the memory capacity for storing the correction coefficient.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 14 is a graph for explaining a case where no torque decrease occurs during table movement.

FIGS. 15(a) and 15(b) are graphs for explaining a case where torque decrease (phase change) occurs during table movement.

DESCRIPTION OF THE PREFERRED EMBODIMENTS

Figure 1:
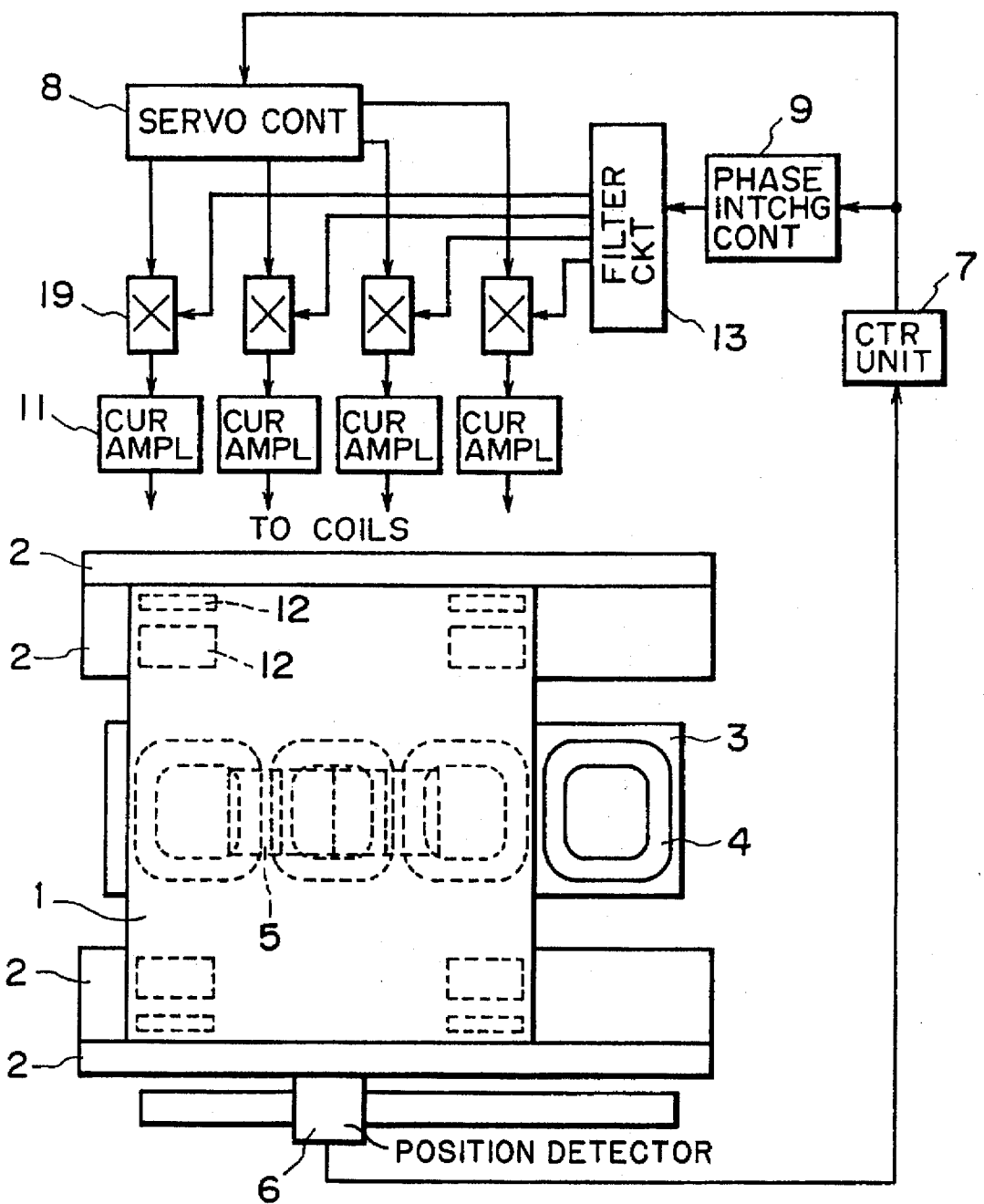
FIG. 1 is a schematic view of a table positioning device according to a first embodiment of the present invention.

FIG. 1 is a schematic view of a positioning table device according to a first embodiment of the present invention. As illustrated, the table positioning device of this embodiment includes a linear motor coil means 4 having four coils (four phases) arrayed along a straight line. The motor coil means 4 is supported by a coil supporting member 3, and a pair of guides 2 are disposed in parallel to the array of the coils constituting the linear motor coil means 4. Mounted on the guides 2 are a pair of upper and lower top plates 1 which are provided to sandwich the linear motor coil 4 with the intervention of guide means 12. The upper and lower top plates 1 are slidably movable in the direction of the coil array, while being guided by the guides 2. The guide means 12 comprises any one of rolling, sliding and static pressure guiding means, for example, which can be selected suitably in consideration of the positioning precision or easiness of maintenance, for example. Each of the upper and lower top plates 1 is provided with movable magnet means 5 which comprises four permanent magnets disposed along the coil array with their magnetic poles disposed alternately. These movable magnets 5 are mounted to the table top plate 1 through the linear motor coil means 104 so that different magnetic poles are opposed to each other.

Provided at the side of the guide 2 is a position detector 6 such as a linear scale, for example, for detecting the position of the table top plate 1. Connected to this position detector 6 is a counter unit 7 for detecting a position signal of the table. Connected to this counter unit 7 is a phase changing controller 9 for changing the coil phase. The controller 9 serves to produce coil selection signals (on/off signals) for the coils, for changing the coil to be energized, in accordance with the table position signal from the counter unit 7. The coil selection signal for each coil is applied to one of input terminals of a multiplier 19 corresponding to that coil. The coil phase is connected to the corresponding multiplier 19 through a corresponding current amplifier 11, such that in response to a coil selection signal (on/off signal) outputted from the controller 9 the output of the multiplier 19 is turned on or off, whereby voltage application to the coil is switched. Connected to the counter unit 7 is a servo controller 8 which serves to calculate a difference between the target position of the table and the current position thereof as detected through the counter unit 7, and to supply corresponding signals to the amplifiers 11 as designated values.

Figure 7:
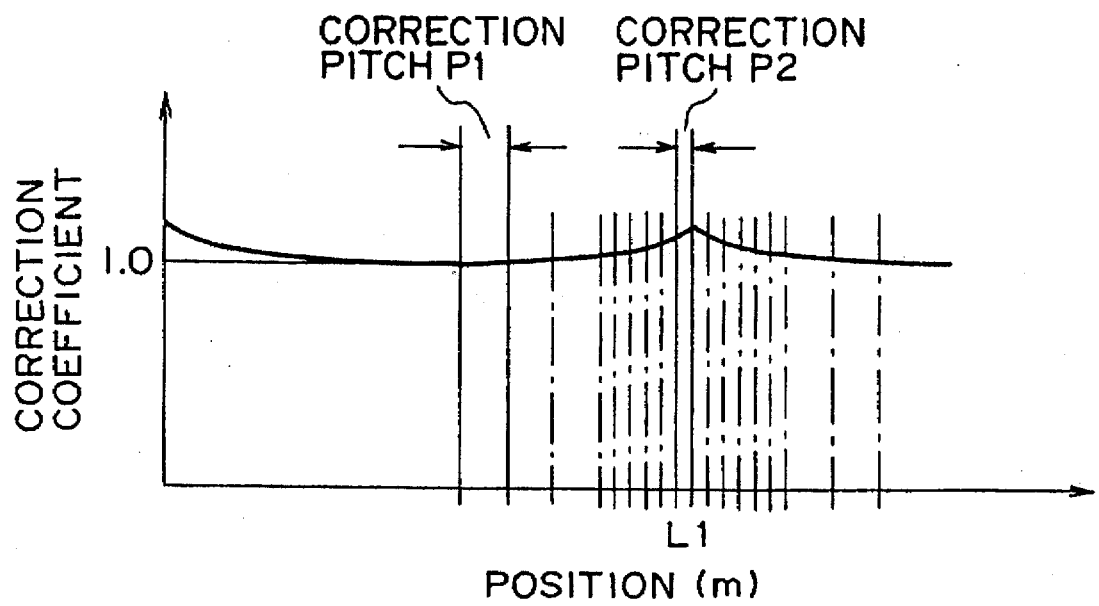
FIG. 7 is a schematic view for explaining a correction coefficient of a table positioning device.

Filter circuit 13 is connected to an output terminal of the controller 9, for supplying coil selection signals (digital outputs) for turning on or off the coils. This filter circuit 13 serves to provide filtering (delaying) to the coil selection signal. The coil selection signal filtered by the filter circuit 13 and the designated electric current magnitude for each coil supplied from the servo control circuit 8 are multiplied with each other in the multiplier 19, thus providing a designated electric current magnitude signal to be applied to the amplifier 11. In the device of FIG. 1, by means of this filter circuit 13, the designated electric current magnitude signal, namely, the switching characteristic for each coil upon phase change can be controlled. The energization pattern of the coils may be such as illustrated in FIG. 7.

Figure 2:
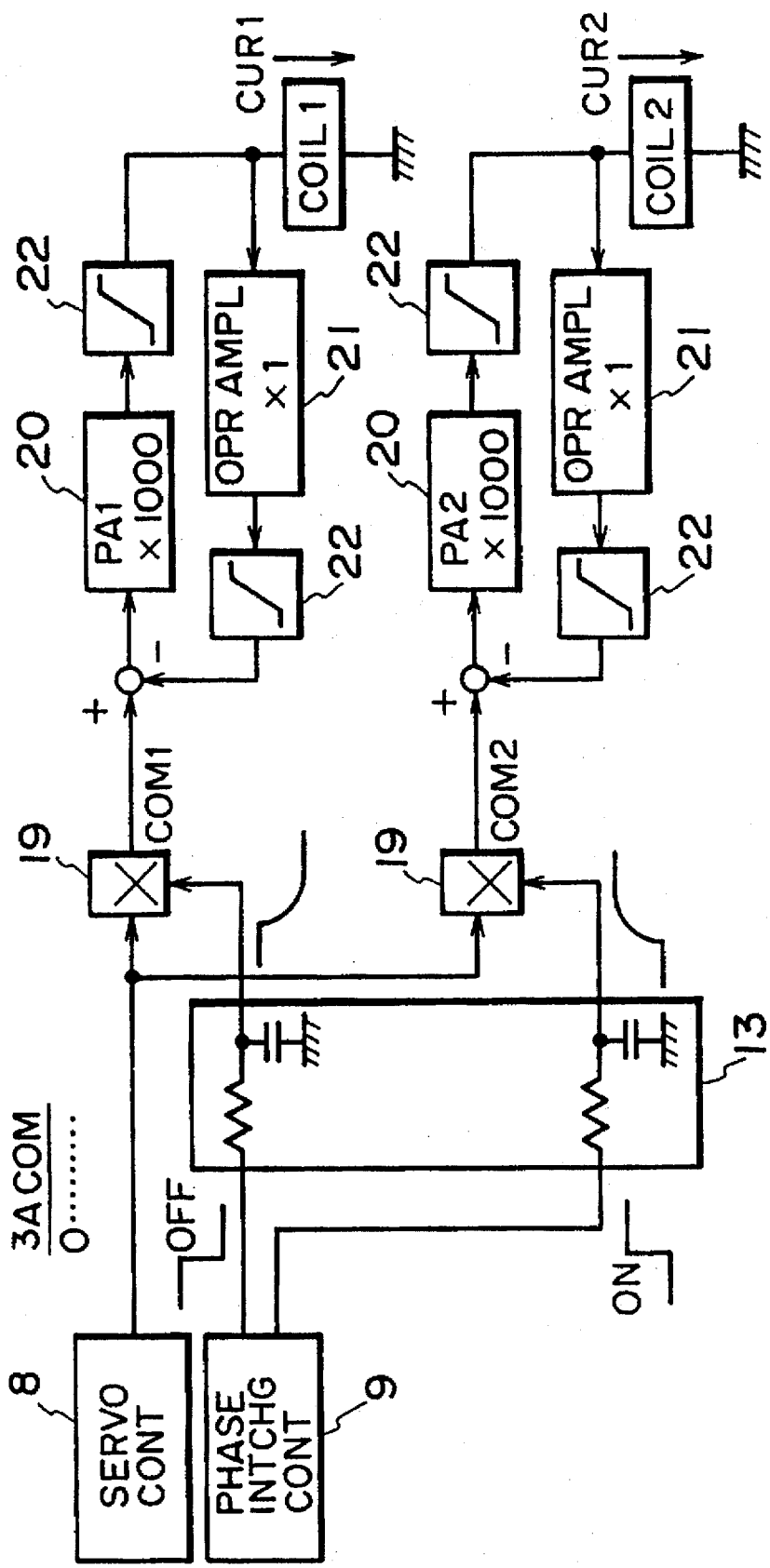
FIG. 2 is a diagram of electric current feedback means of a table positioning device according to the present invention.

FIG. 2 shows details of electric current feedback means of the present invention. For simplicity of explanation, only coil 1 and coil 2 are illustrated.

Figure 3A:
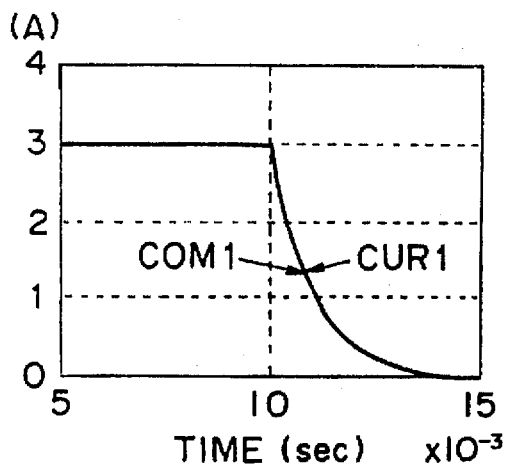
FIGS. 3A–3D show waveforms at portions of the current feedback means.
Figure 3C:
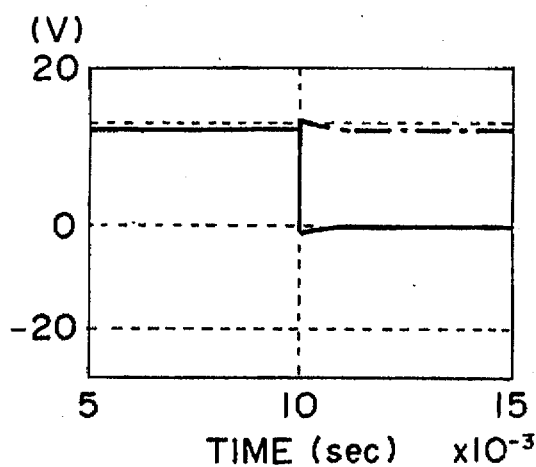
Figure 3B:
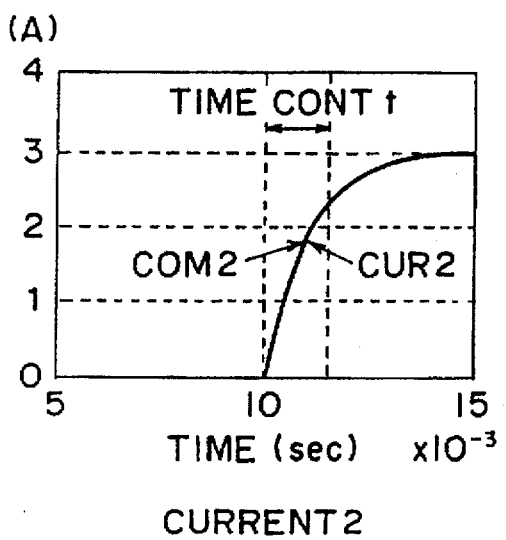
Figure 3D:
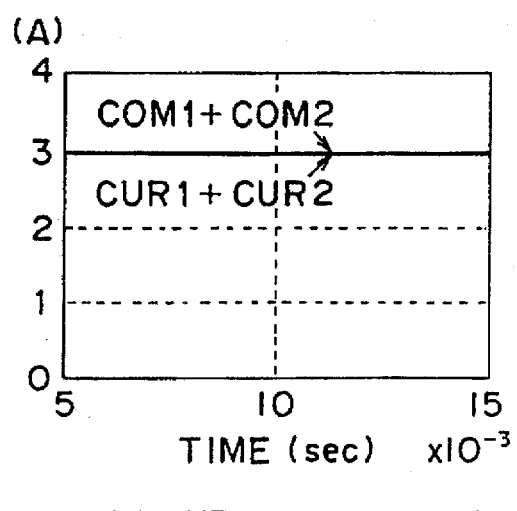

In this example, as a practical and inexpensive filter circuit, a low pass filter comprising a resistor R and a capacitor C is used. Digital signal (on/off signal) passes this R-C low pass filter and then it is multiplied with the designated current magnitude from the servo controller 8. Thus, a resultant designated electric current magnitude signal to be applied to the current amplifier takes a charge/discharge curve such as shown in FIG. 3A or 3B, having a slow delay time (time constant) t. With such a slow designated value, the output of the power operational amplifier is not saturated (FIG. 3C) and the electric current can follow the designated value. Adding the electric current curves of these coils at the time of phase change with each other results in the current magnitude such as shown in FIG. 3D, as having a flat characteristic with the ripple being removed. Consequently, decrease of motor torque can be suppressed.

Here, it is necessary to set the waveforms of designated current magnitude signals so that the combined current of the coils 1 and 2 do not substantially change. To this end, the delay time t should desirably be set so that the current loop is not saturated.

Figure 4:
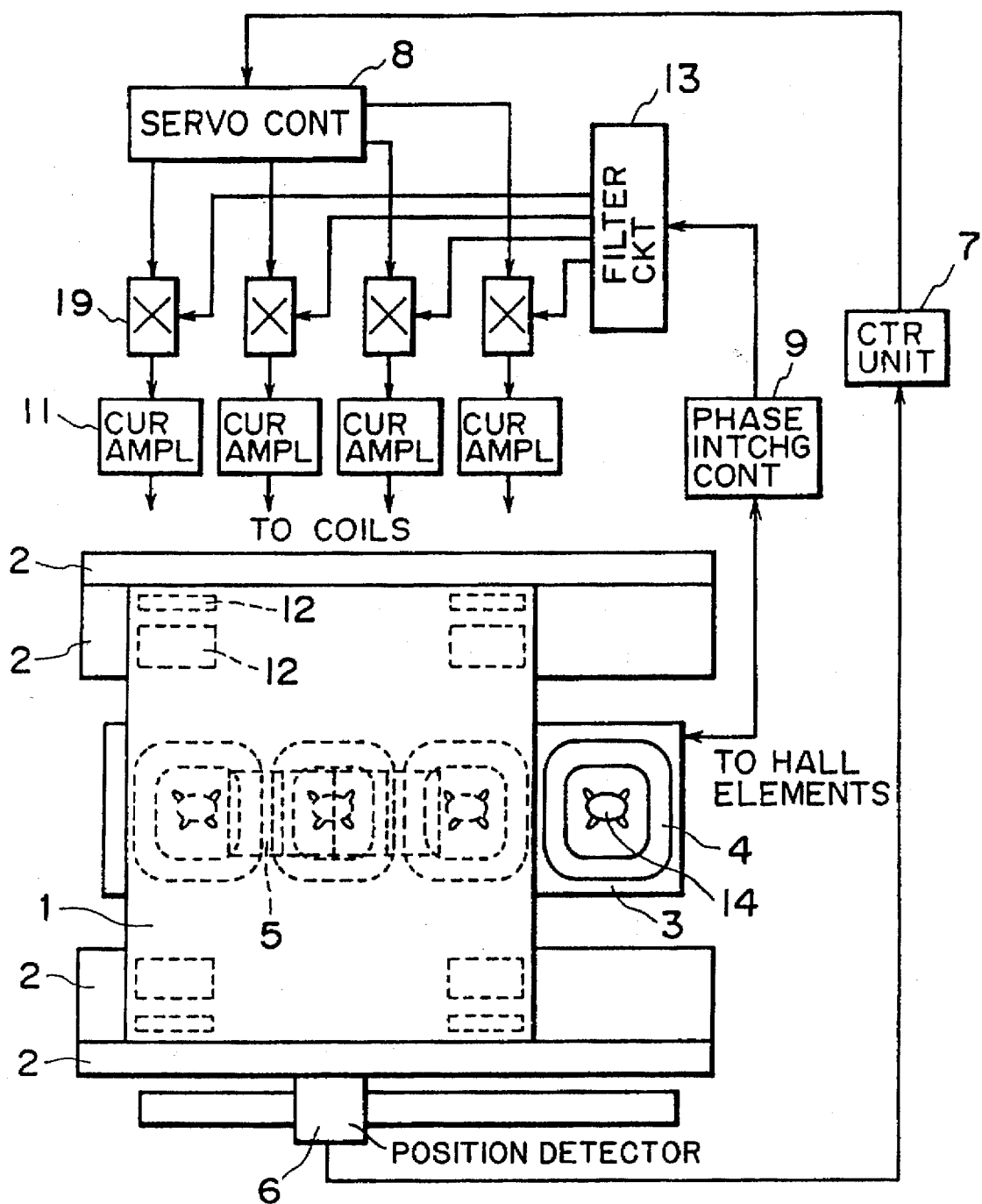
FIG. 4 is a schematic view of a table positioning device according to a second embodiment of the present invention.

FIG. 4 is a schematic view of a positioning table device according to a second embodiment of the present invention. Since the device of this embodiment has a similar structure as that of the first embodiment, description will be made mainly to the differences thereof from the first embodiment.

The positioning table device of the present invention may be provided, for the phase change, with a magnetic or optical position detecting element 14 separately from the position detector 6.

For example, as shown in FIG. 4, in the central portion of each coil constituting the linear motor coil means 4 of the device of the present invention, a Hall element 14 for detecting a magnetic field is provided. Each Hall element 14 is connected to the phase change controller 9. As a magnetic field is applied to the Hall element 14 by the permanent magnet 5, the Hall element detects the position of the magnetic pole of the permanent magnet 5 accurately and converts it into an electric signal which is then applied to the phase change controller 9. Then, the controller 9 operates to energize (turn on) the coil phases sequentially in accordance with the table position, essentially in the same manner as the first embodiment.

The coil selection signals of digital outputs produced by the controller 9 for turning on/off the coils are communicated with the filter circuit 13. Each coil selection signal treated by this filter circuit and the designated current signal for each coil are multiplied with each other by a corresponding multiplier 19. Through this filter circuit, the switching characteristics of each coil can be controlled.

Thus, also in this embodiment, a decrease of torque can be minimized.

In the first and second embodiments described above, an optical or magnetic linear scale is used as the position detector 6. However, if the invention is applied to a positioning table device in a semiconductor exposure apparatus, a laser distance measuring device having a higher resolution may preferably be used.

Figure 5:
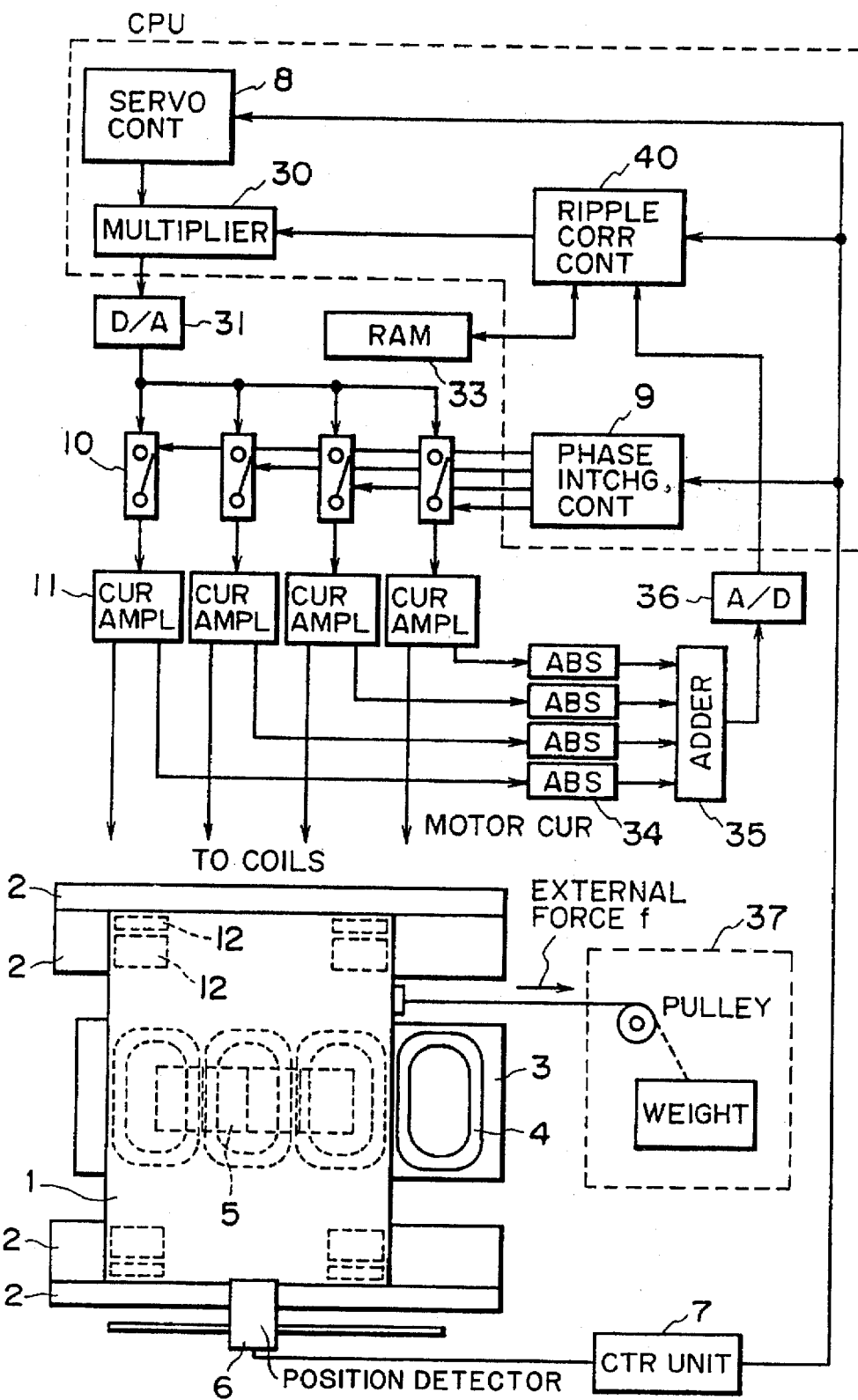
FIG. 5 is a schematic view of a table positioning device according to a third embodiment of the present invention.

FIG. 5 is a schematic view of a positioning table device according to a third embodiment of the present invention. As illustrated in the drawing, the positioning table device of this embodiment comprises linear motor coil means 4 having four coils (four phases) arrayed along a straight line. The linear motor coil means 4 is supported by a coil supporting member 3, and a pair of guides 2 are disposed in parallel to the array of the coils constituting the linear motor coil means 4. Table top plate 1 is mounted on the guides 2 with a guide means 12 interposed therebetween. The table top plate 1 is slidably movable in the direction of the coil array, while being guided by the guides 2. The guide means 12 comprises any one of rolling, sliding and static pressure guiding means, for example, which can be selected suitably in consideration of the positioning precision or easiness of maintenance, for example. The top plate 1 is provided with movable magnet means 5 which comprises four permanent magnets disposed along the coil array with their magnetic poles disposed alternately.

Provided at the side of the guide 2 is a position detector 6 such as a linear scale, for example, for detecting the position of the table top plate 1. Connected to this position detector 6 is a counter unit 7 for detecting a positional signal of the table. Connected to this counter unit 7 is a phase changing controller 9 for changing the coil phases. The controller 9 serves to turn and control the switches 10, in accordance with the table position signal from the counter unit 7. The coil phase 4 is connected to each switch 10 through a corresponding current amplifier 11. In response to coil selection signals produced by the controller 9, each switch 10 can be turned to apply a voltage to corresponding coil 4.

Connected to the counter unit 7 is a servo controller 8 which serves to calculate (e.g. by PID calculation) a difference between the target position of the table and the current position thereof as detected through the counter unit 7, and to supply a corresponding signal to the amplifiers 11 as designated values.

An energization pattern of the linear motor coil 4 may be such as depicted in FIG. 11. The direction (sign) of current changes with the position of the stage (table 1), and the current of each coil is detected by using absolute value circuits 34. By adding the detected currents by means of an adder 35, the sum of motor currents is detectable.

The phase change controller 9, the servo controller 8 and the ripple correction controller 40 of this embodiment are accomplished by software computation by a CPU (microcomputer).

The ripple correction controller 40 reads the motor current through an A/D converter 36, at a predetermined measurement pitch (interval). Since substantially no current flows during constant speed movement, a certain external force may be applied in the direction of advancement of the table 1 so as to assure flow of a certain electric current (bias current). As for this external force applying mechanism 37, a weight may be used together with a pulley.

Figure 6:
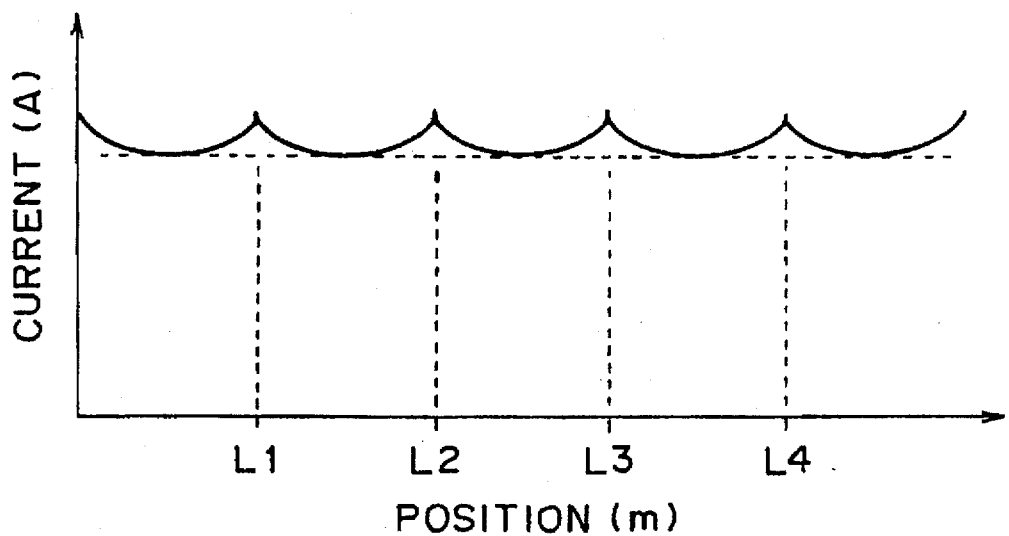
FIG. 6 is a graph showing an electric current waveform during constant speed motion of a table positioning device.
Figure 17:
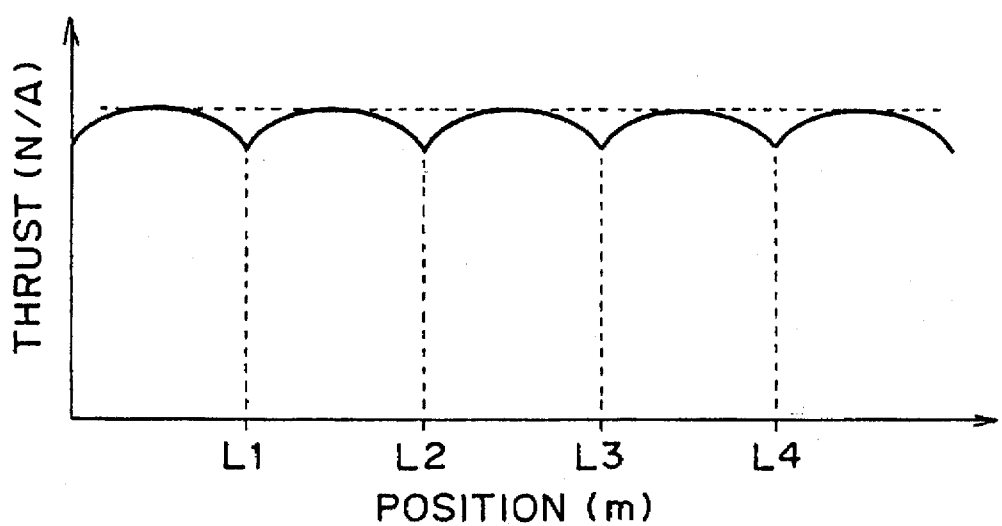
FIG. 17 is a graph for explaining thrust characteristics of a multiphase linear motor.
Figure 18:
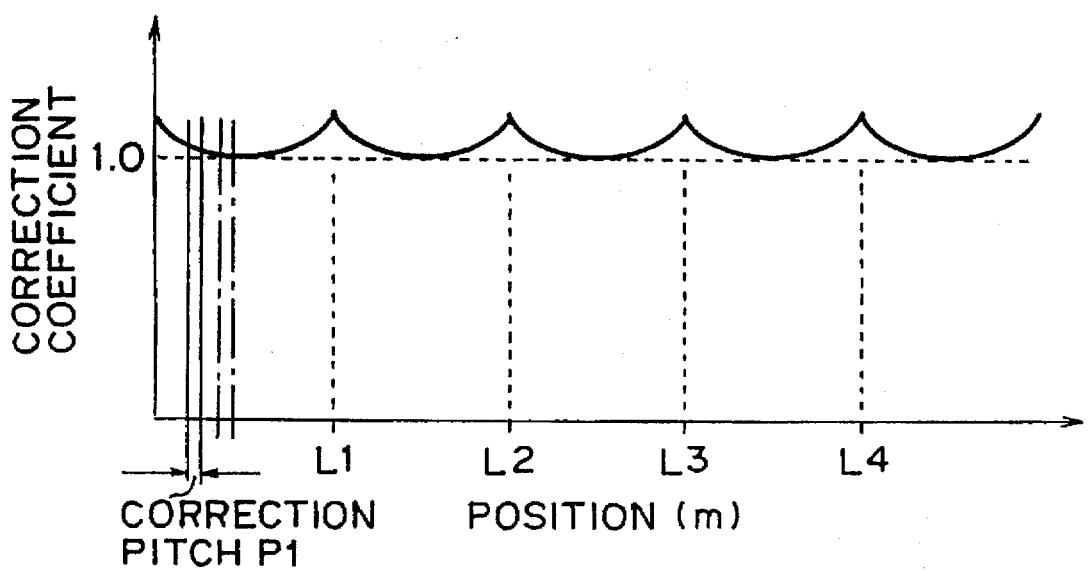
FIG. 18 is a graph for explaining a correction coefficient of a an example of positioning table device.
Figure 19:
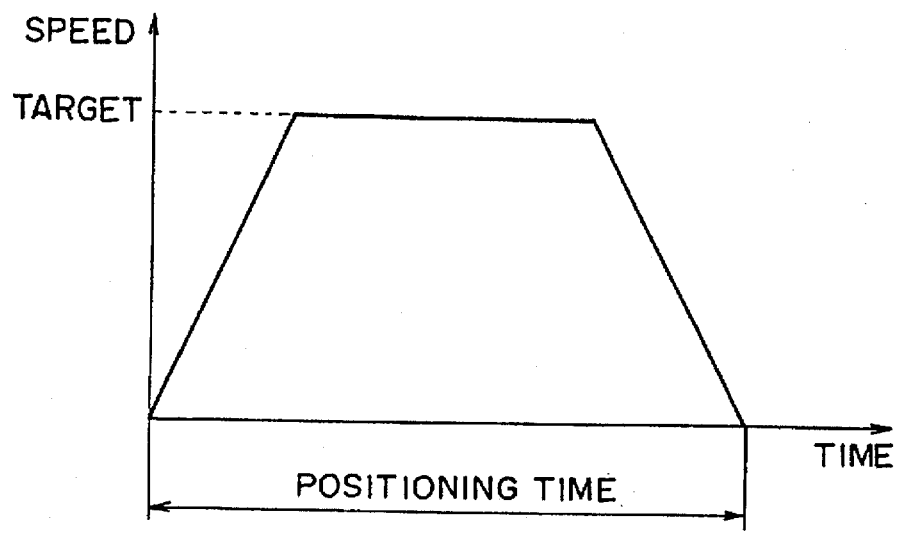
FIG. 19 is a graph of a speed waveform in a case where no thrust ripple occurs during table movement.
Figure 20A:
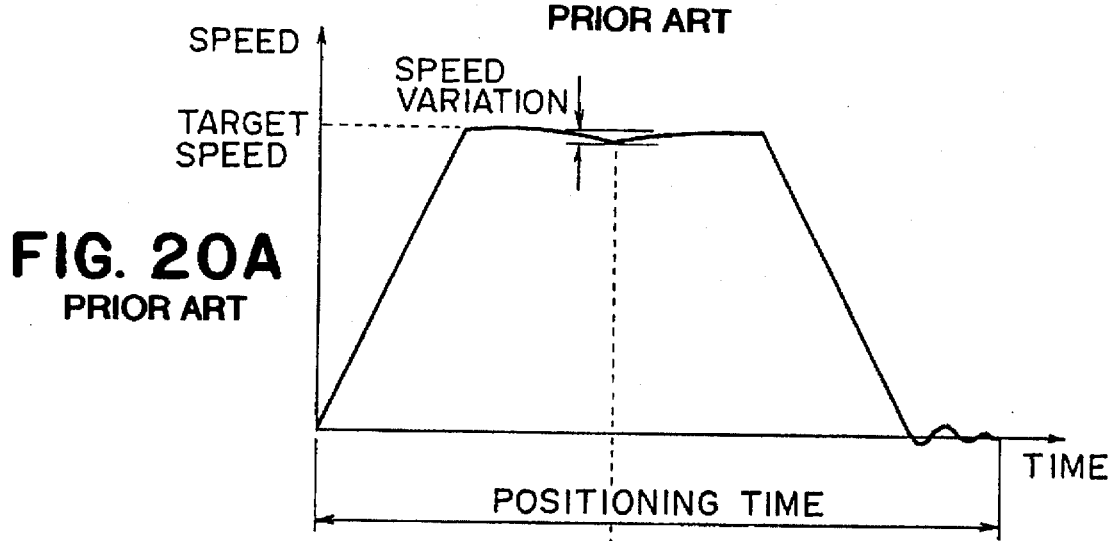
FIGS. 20(a) and 20(b) are graphs of a speed waveform in a case where thrust ripple occurs during table movement.
Figure 20B:
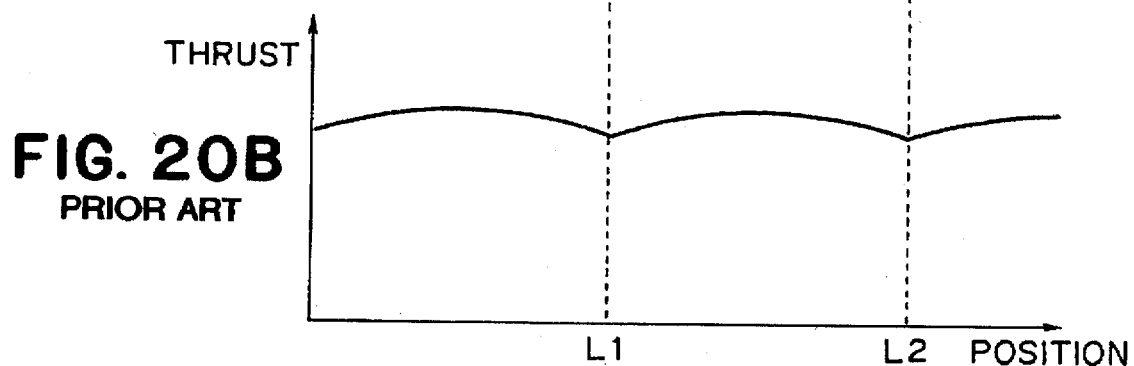

FIG. 6 shows the motor current when the table is driven without thrust correction. At each switching position, the magnitude of current increases. This is because the signal from the servo controller 8 increases so as to compensate for the decrease of thrust of the linear motor (FIG. 17). Thus, the motor current during constant speed movement represents the thrust characteristic. By reading the motor current during constant speed movement, it is possible to determine a correction coefficient such as shown in FIG. 18 through calculation by the ripple correction controller 40. The thus determined correction coefficient is stored into a random access memory (RAM) 33.

Further, as illustrated in FIG. 7, the correction pitch P may be reduced (as P2) in the vicinity of the phase changing position, whereas it may be made larger (as P1) in the remaining portion wherein thrust change is small. This enables efficient thrust correction, while saving the memory.

In accordance with these embodiments of the present invention, as described hereinbefore, it is possible to determine a correction coefficient in a short time and without complicated operation, while keeping the linear motor mounted in the positioning table device. Therefore, by measuring the motor current periodically before a start of a drive of the table and by determining an optimum correction coefficient at that time, good conditions of the positioning stage can be held constantly.

Figure 8:
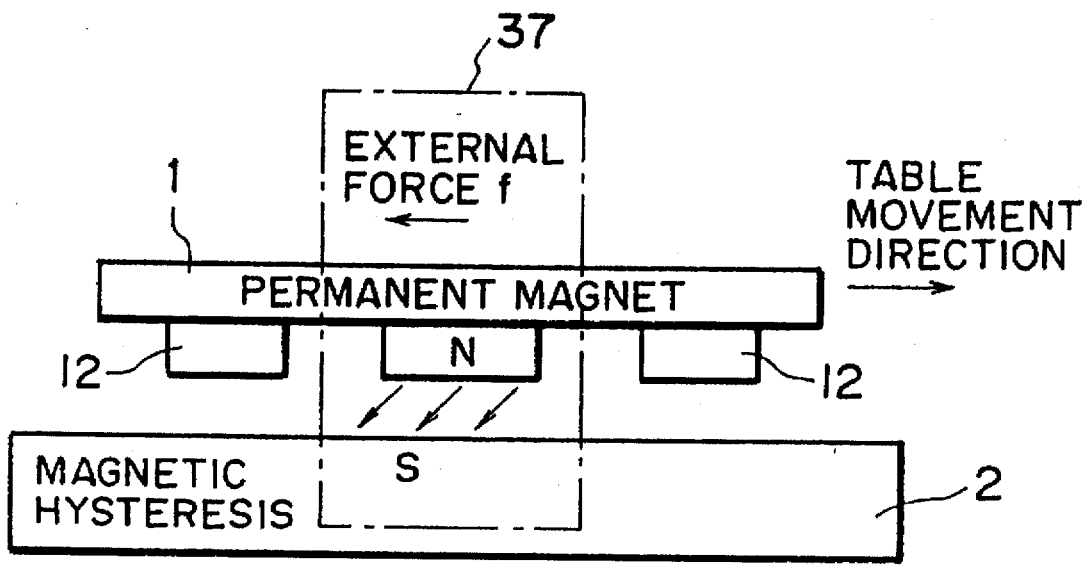
FIG. 8 is a schematic view for explaining an external force producing mechanism used with a static pressure bearing device.

In the embodiment described above, the external force applying mechanism is simple: a weight is hung. However, depending on the structure of the positioning table device, it may take various forms. FIG. 8 shows an example wherein simple-floating static pressure guide means is used as a guide. In such a simple floating static pressure guide, a permanent magnet may be used to attract the guide to enhance the bearing rigidity. When the table moves in this state, an external force f in a direction opposite to the movement direction can be produced due to the magnetic hysteresis, such as depicted in the drawing.

Further, while an optical or magnetic linear scale is used in the above-described embodiment as the position detector 6, in a case of a highest precision positioning table device to be used in a semiconductor exposure apparatus, a laser distance measuring device having a higher resolution may be preferably used. Moreover, while a signal from a linear scale is used in the above-described embodiment to change the phase of the multiphase linear motor, Hall elements may be disposed each in a central portion of a corresponding coil to detect a magnetic field, so as to change the phase successively.

Figure 9:
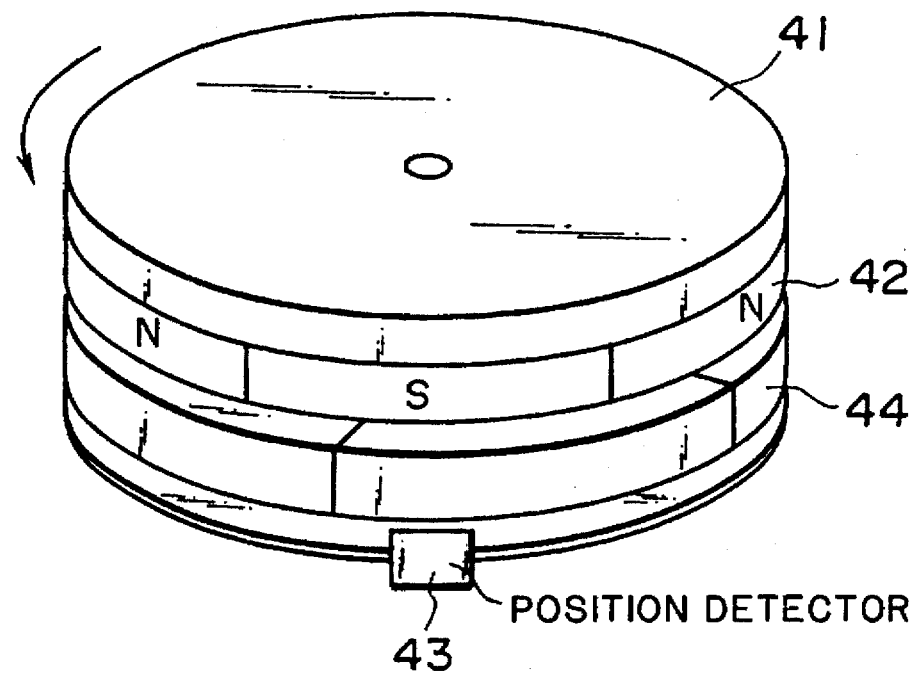
FIG. 9 is a perspective view of a rotary type stage device.
Figure 10:
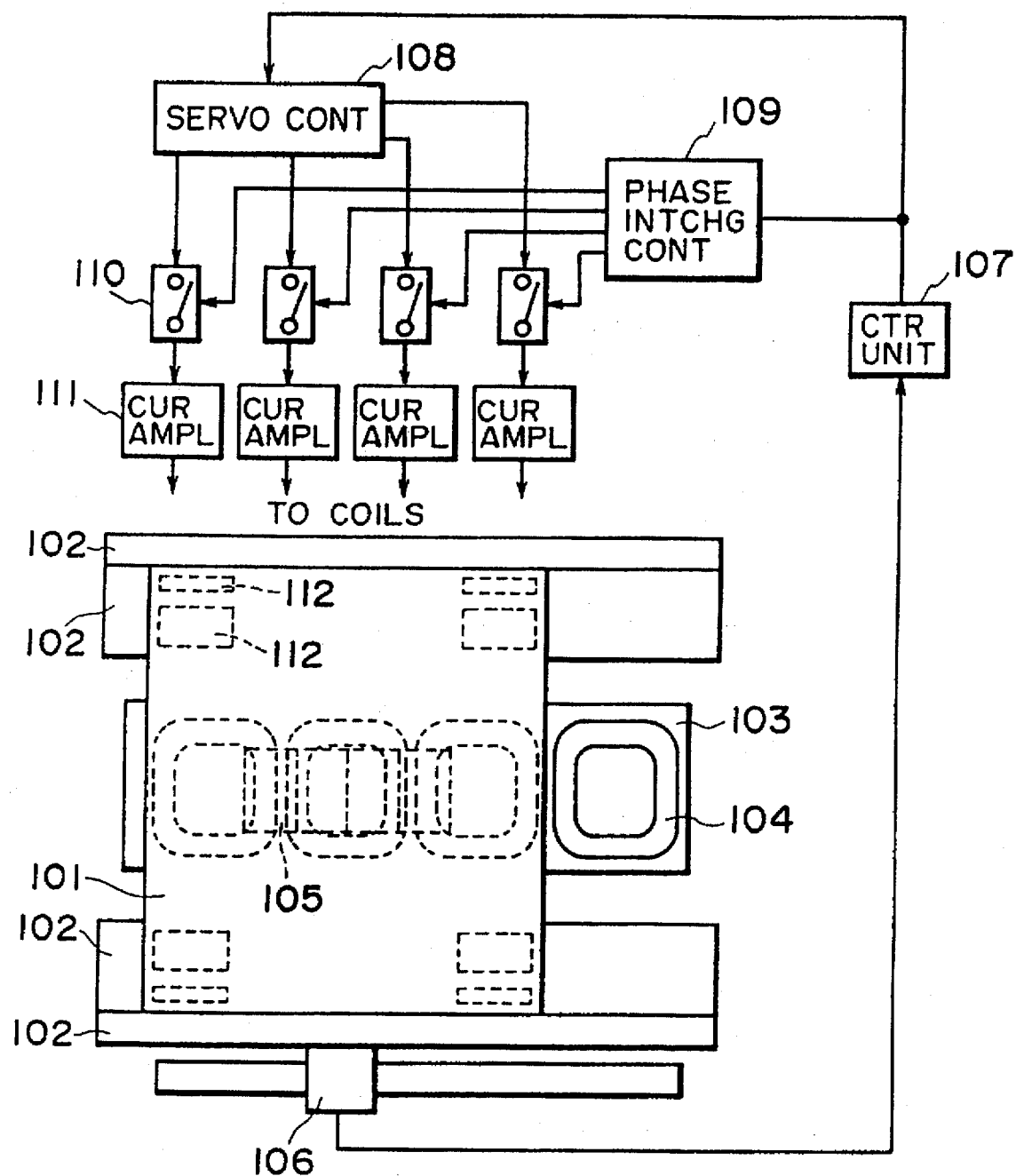
FIG. 10 is a schematic view of an example of a table positioning device.
Figure 11A:
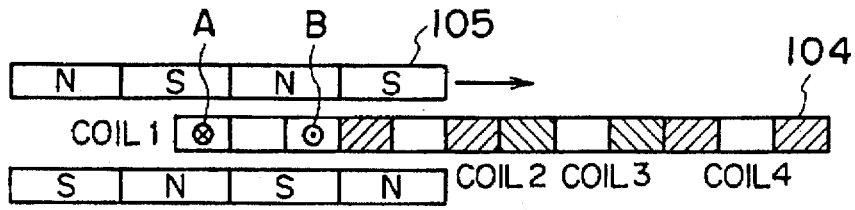
FIG. 11 is a schematic view of an example of linear motor coil energizing patterns memorized in a positioning table device.
Figure 11B:
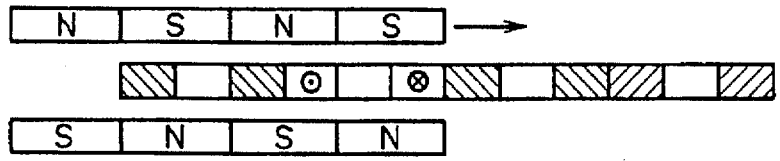
Figure 11C:
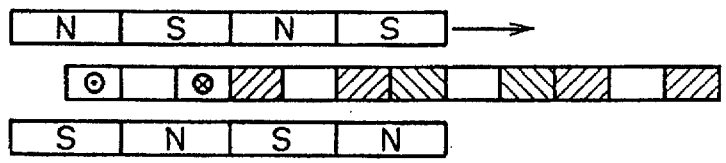
Figure 11D:
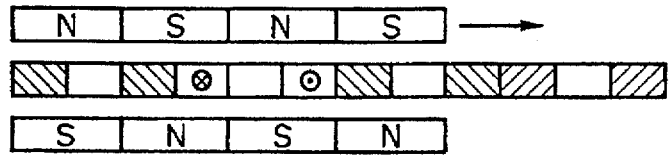
Figure 11E:
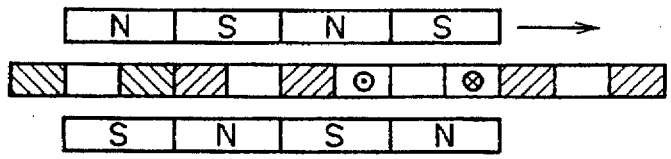
Figure 11F:
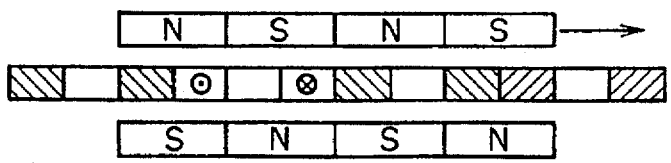
Figure 11G:
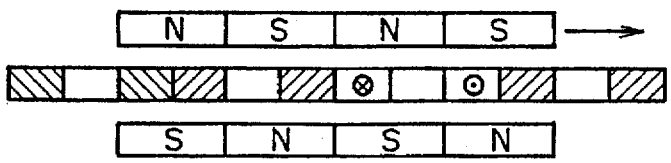
Figure 11H:
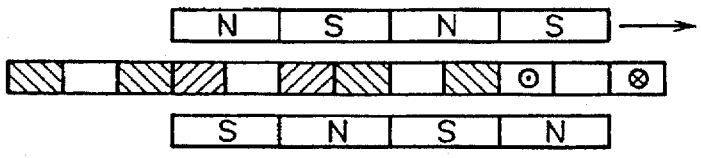
Figure 12:
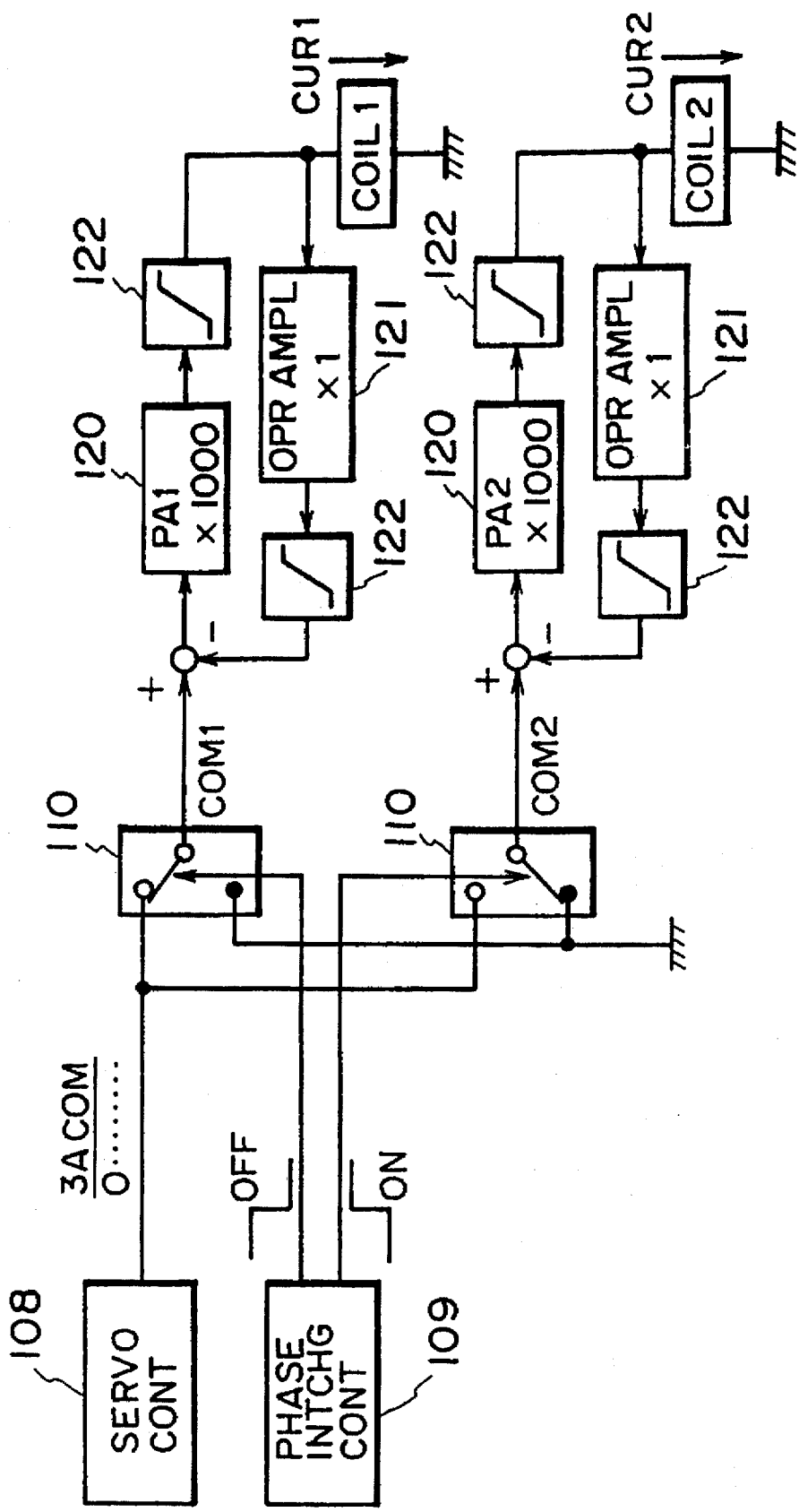
FIG. 12 is a diagram of an example of electric current feedback means of a table positioning device.
Figure 13A:
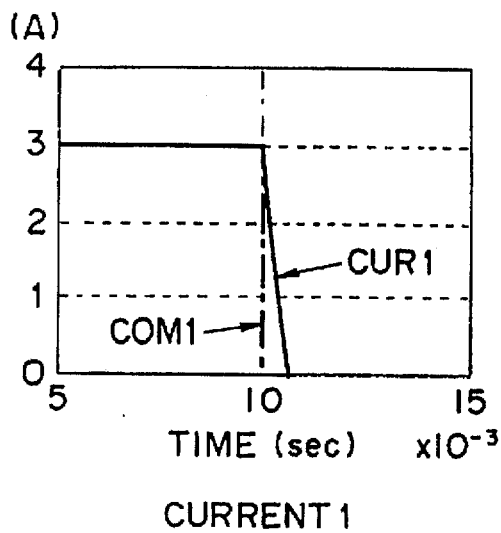
FIGS. 13A–13D show waveforms at portions of the current feedback means.
Figure 13C:
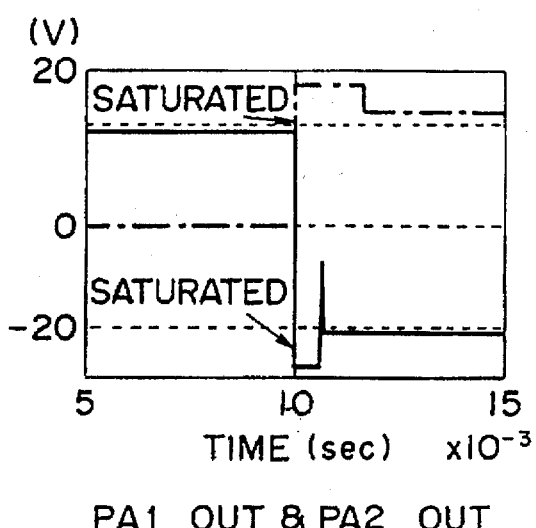
Figure 13B:
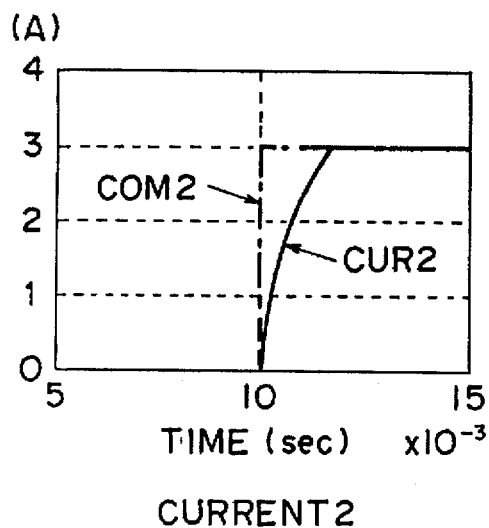
Figure 13D:
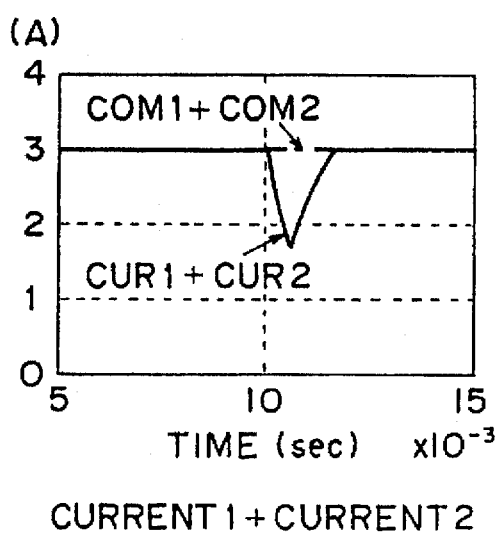
Figure 16:
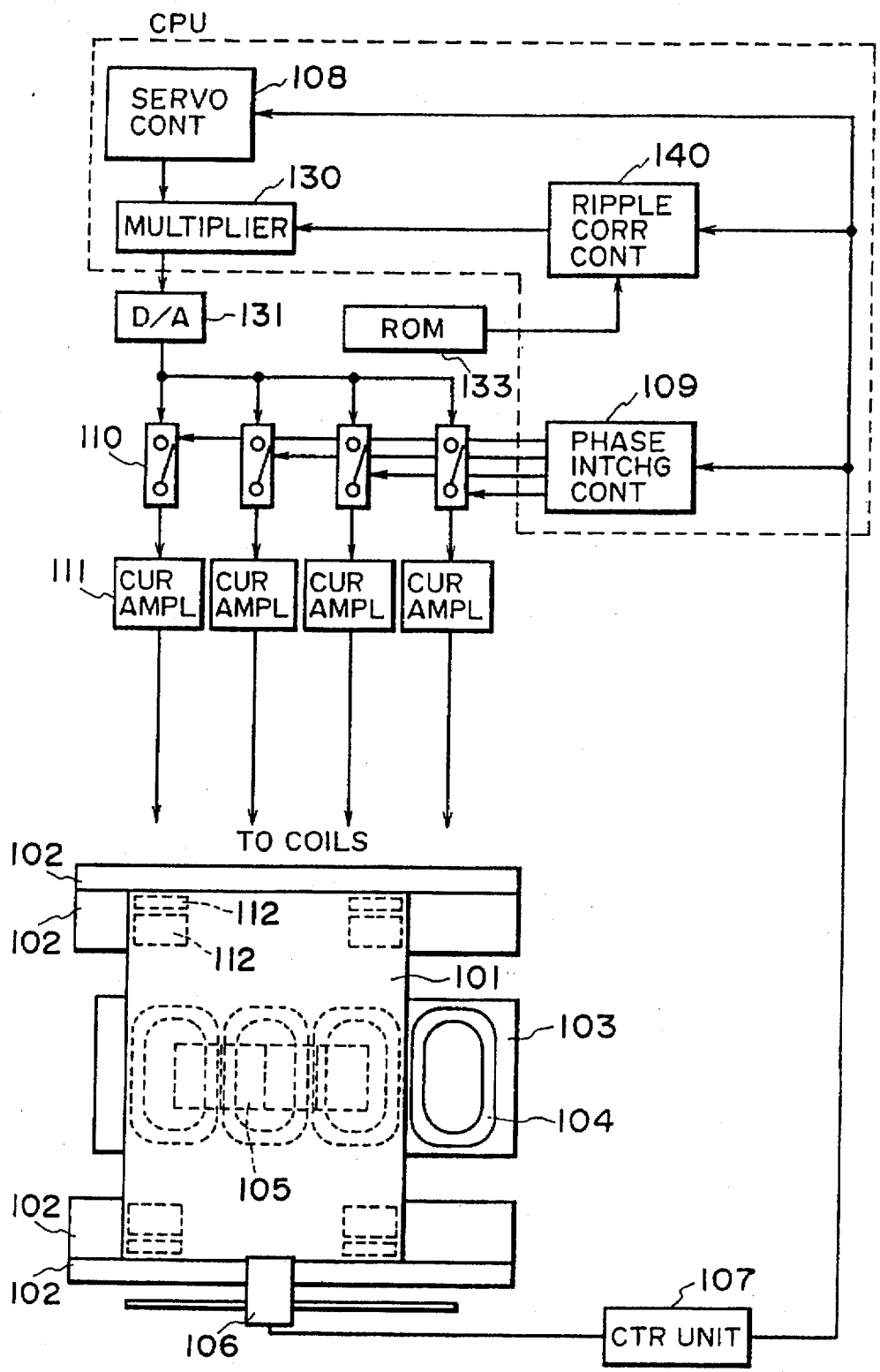
FIG. 16 is a schematic view of an example of a positioning table device.

Further, the present invention is applicable to a rotary type stage device having a multiphase motor of circular shape such as shown in FIG. 9. In this example, movable magnet means 42 may be provided below a rotatable top plate 41. The motor current may be read in accordance with a position signal produced by a position detector 43, and the correction coefficient may be calculated co attain ripple correction.

While the invention has been described with reference to the structures disclosed herein, it is not confined to the details set forth and this application is intended to cover such modifications or changes as may come within the purposes of the improvements or the scope of the following claims.

What is claimed is:

1. A positioning table device comprising:

a table;

guiding means for guiding movement of said table in a predetermined direction;

driving means for producing a thrust for moving said table along the predetermined direction in association with said guiding means, said driving means including a permanent magnet provided on said table and a plurality of coils provided along the predetermined direction, said plurality of coils being movable to be opposed to said permanent magnet sequentially with the movement of said table guided by said guiding means;

position detecting means for detecting a position of said table in the predetermined direction and for producing a detection output;

designating means for designating an energization electric current in accordance with the detection output of said position detecting means and for outputting a current designation signal;

coil selecting means for selecting a coil, of said plurality of coils, to be energized in accordance with the position of said table in the predetermined direction and for outputting a coil selection signal;

correcting means for correcting the energization electric current designated by said designating means when coils to be energized are changed by said coil selecting means, such that a change in coil energization electric current is slowed, whereby combined energization electric currents applied to said coils are maintained substantially at a constant magnitude, said correcting means comprising (i) a filter for slowing a change in the coil selection signal output from said coil selecting means, for changing coils to which electric current is supplied, and (ii) multipliers respectively associated with said coils, each multiplier applying to current supplying means, as a correction current signal, a product of an output of said filter and the current designation signal output from said designating means; and current supplying means for energizing the coil selected by said coil selecting means, in accordance with the energization electric current corrected by said correcting means.

2. A device according to claim 1, wherein the coil selection output signal from said coil selecting means comprises a digital signal, and wherein said filter provides a delay operation to the coil selection output signal.

3. A device according to claim 2, wherein said filter performs the delay operation with a delay time determined so as not to saturate said current supplying means.

4. A device according to claim 1, wherein said coil selecting means selects a coil of said coils to be energized in accordance with the position of said table as detected by said position detecting means.

5. A device according to claim 1, wherein said position detecting means comprises Hall elements respectively associated with said coils.

6. A positioning table device comprising:

a table;

guiding means for guiding movement of said table in a predetermined direction;

driving means for producing a thrust for moving said table along the predetermined direction in association with said guiding means, said driving means including a permanent magnet provided on said table and a plurality of coils provided along the predetermined direction, said plurality of coils being movable to be opposed to said permanent magnet sequentially with the movement of said table guided by said guiding means;

position detecting means for detecting a position of said table in the predetermined direction;

designating means for designating an energization electric current in accordance with an output of said position detecting means;

coil selecting means for selecting a coil, of said coils to be energized, in accordance with the position of said table in the predetermined direction;

storing means for memorizing a correction coefficient for correcting the energization electric current designated by said designating means, in accordance with the position of said table in the predetermined direction;

correcting means for correcting the energization electric current designated by said designating means on the basis of the correction coefficient memorized in said storing means, so as to compensate for a thrust ripple of said driving means produced as coils opposed to said permanent magnet are changed with the movement of said table;

current supplying means for energizing the coil selected by said coil selecting means, in accordance with the energization electric current corrected by said correcting means;

measuring means for measuring, during constant speed motion of said table and at intervals of movement of said table through a predetermined pitch, a sum of absolute values of the energization electric currents applied to said coils from said current supplying means; and control means for causing said storing means to memorize a value determined on the basis of the measurements by said measuring means, as the correction coefficient.

7. A device according to claim 6, further comprising external force producing means for applying an external force to said table independently of said driving means when said table is moved in the predetermined direction at a constant speed.

8. A device according to claim 6, wherein the correction coefficient satisfies a relation P1>P2 where P1 is a first movement pitch of said table in a first portion of the movement of said table in the predetermined direction, in which first portion there does not occur a change of coils to be opposed to said permanent magnet, and where P2 is a second movement pitch of said table in a second portion of the movement of said table in the predetermined direction, in which second portion coils to be opposed to said permanent magnet are changed.

* * * * *

UNITED STATES PATENT AND TRADEMARK OFFICE
CERTIFICATE OF CORRECTION

PATENT NO. : 5,666,038
DATED : September 9, 1997
INVENTOR(S) : SHINJI OHISHI

It is certified that error appears in the above-identified patent and that said Letters Patent is hereby corrected as shown below:

COLUMN 3

Line 4, "Thus,at" should read --Thus, at--.

COLUMN 4

Line 2, "of" (first occurrence) should read --with--.
　　　Line 58, "not" should read --not to--.

COLUMN 6

Line 11, "of a an example of" should read --of an example of a--.

COLUMN 9

Line 28, "simple floating" should read --simple-floating--.
　　　Line 51, "co" should read --to--.

Signed and Sealed this

Fourteenth Day of April, 1998

Attest:

BRUCE LEHMAN

*Attesting Officer*    *Commissioner of Patents and Trademarks*